(12) United States Patent
Yin et al.

(10) Patent No.: US 9,455,067 B2
(45) Date of Patent: Sep. 27, 2016

(54) LOW DIELECTRIC MATERIALS

(71) Applicant: ITEQ CORPORATION, Hsinchu County (TW)

(72) Inventors: Meng-Song Yin, Hsinchu County (TW); Li-Chun Chen, Hsinchu County (TW)

(73) Assignee: ITEQ CORPORATION, Xinpu Township, Hsinchu County (TW)

( * ) Notice: Subject to any disclaimer, the term of this patent is extended or adjusted under 35 U.S.C. 154(b) by 0 days.

(21) Appl. No.: 14/982,957

(22) Filed: Dec. 29, 2015

(65) Prior Publication Data

US 2016/0148719 A1    May 26, 2016

Related U.S. Application Data

(63) Continuation-in-part of application No. 13/845,908, filed on Mar. 18, 2013, now Pat. No. 9,257,212.

(51) Int. Cl.
| | |
|---|---|
| *H01B 3/42* | (2006.01) |
| *C08L 71/12* | (2006.01) |
| *H01B 3/44* | (2006.01) |
| *C08L 79/08* | (2006.01) |
| *H01B 3/30* | (2006.01) |

(Continued)

(52) U.S. Cl.
CPC .............. *H01B 3/427* (2013.01); *C08L 71/12* (2013.01); *C08L 79/085* (2013.01); *H01B 3/306* (2013.01); *H01B 3/307* (2013.01); *H01B 3/44* (2013.01); *H01B 3/442* (2013.01); *H01B 3/448* (2013.01); *H05K 1/0373* (2013.01); *H05K 1/0366* (2013.01); *H05K 3/022* (2013.01)

(58) Field of Classification Search
CPC ......... H01B 3/427; H01B 3/44; C08L 71/12; C09K 19/542; C09K 19/546
See application file for complete search history.

(56) References Cited

U.S. PATENT DOCUMENTS

| | | | |
|---|---|---|---|
| 6,759,460 B2 * | 7/2004 | Kamo ................... | C08L 71/123 524/100 |
| 7,282,554 B2 | 10/2007 | Mitsui et al. | |
| 2008/0071000 A1 * | 3/2008 | Braidwood ........... | C08F 283/08 521/134 |

(Continued)

FOREIGN PATENT DOCUMENTS

| | | |
|---|---|---|
| CN | 101289545 A | 10/2008 |
| CN | 101314630 A | 12/2008 |

(Continued)

OTHER PUBLICATIONS

Wang Yongqiang, et al., "Fire-retardant Materials and Its Application", Chemical Industry Press, Materials Science and Engineering Publishing Center, 2003 pp. 1-7.

*Primary Examiner* — Vickey Nerangis
(74) *Attorney, Agent, or Firm* — Muncy, Geissler, Olds & Lowe PC

(57) ABSTRACT

The invention provides a low dielectric material. The low dielectric material comprises: (i) 5-50 parts by weight of polyphenylene ether (PPE) resin having a Mw of 1000~7000, a Mn of 1000-4000 and Mw/Mn=1.0-1.8; and (ii) 10-90 parts by weight of liquid crystal polymer with allyl group having a Mw of 1000~5000, a Mn of 1000-4000 and Mw/Mn=1.0-1.8, wherein the dielectric material has Dk of 3.4-4.0 and Df of 0.0025-0.0050. The dielectric material is suitably used in prepregs and insulation layers of a circuit board, because it has high Tg, low thermal expansion coefficient, low moisture absorption and excellent dielectric properties such as Dk and Df.

12 Claims, 1 Drawing Sheet

(51) Int. Cl.
  *H05K 1/03* (2006.01)
  *H05K 3/02* (2006.01)

(56) References Cited

U.S. PATENT DOCUMENTS

| | | |
|---|---|---|
| 2009/0203279 A1 | 8/2009 | Mori et al. |
| 2013/0252003 A1 | 9/2013 | Liu |
| 2014/0275335 A1 | 9/2014 | Yin et al. |
| 2014/0275377 A1* | 9/2014 | Yin .................. H01B 3/306 524/290 |

FOREIGN PATENT DOCUMENTS

| | | |
|---|---|---|
| CN | 101570640 A | 11/2009 |
| CN | 101692756 A | 4/2010 |
| CN | 102336935 A | 2/2012 |
| JP | 2010111758 A | 5/2010 |
| JP | 20111473 A | 1/2011 |
| TW | 200740309 A | 10/2007 |
| TW | 200813124 A | 3/2008 |
| TW | 200823246 A | 6/2008 |
| TW | 201124478 A | 7/2011 |

* cited by examiner

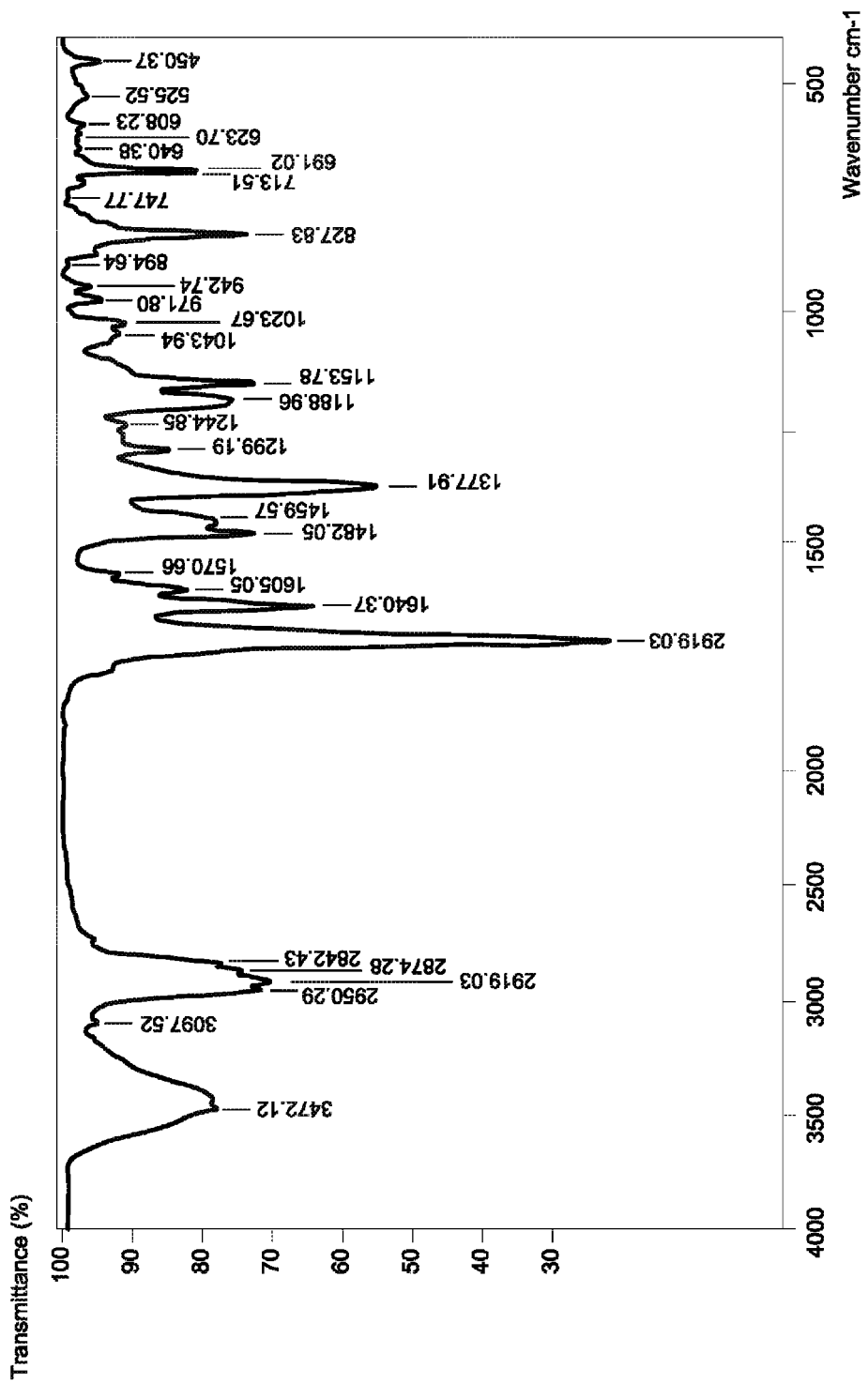

LOW DIELECTRIC MATERIALS

CROSS REFERENCE TO RELATED APPLICATIONS

This application is a Continuation-in-Part of co-pending application Ser. No. 13/845,908, filed on Mar. 18, 2013. The entire contents of which are hereby incorporated by reference.

BACKGROUND OF THE INVENTION

1. Technical Field

The invention relates to a material with low dielectric loss, particularly to a resin composition.

2. Related Art

As developed with wireless transmission products and technologies of transmitting high frequency, epoxy resin and novolak resin cannot satisfied for the advance application, especially high frequency printed circuit board (PCB). Fluorine-containing resin can be used as PCB with low dielectric loss. However, fluorine-containing resin is expensive and not easy to work, and thus limited to the use of military and astrodynamics. In addition, polyphenylene ether (PPE) resin has excellent mechanical property and dielectric property such as Dk and Df. Therefore, the PPE resin is preferable to be used a material for high frequency PCB.

However, because the PPE resin is a thermal plastic resin, as applied in a copper-clad laminate, it may has disadvantages as follows: it is not easy to work due to a high melting viscosity of PPE resin, interlayer film is easy released in a solvent clean step during a process for manufacturing PCB due to a poor solvent resistance of PPE resin, and it is not easy to operate above a temperature of 250° C. in soldering process due to melting point close to Tg. Therefore, PPE resin has to be modified by curing so as to meet the requirement of using in PCB.

Curing modification of PPE resin generally has two manners: PPE resin may become curable resin by introducing crosslinking active functional groups to molecular structure of PPE resin. Alternatively, PPE resin may become co-mixing curable composite material by introducing other curable resins to molecular structure of PPE resin with co-mixing modification or interpenetrating network technology. However, PPE resin is likely incompatible with the active functional groups or curable resins, because the polar difference exists in their chemical structures. Alternatively, PPE resin may lose the excellent properties, after it conducts curing modification with the active functional groups or curable resins.

Therefore, there is a need to develop a material has excellent dielectric properties and other properties such as high Tg, low coefficient of thermal expansion and low water absorption of PCB requirement. Also, the material can be applied in the manufacture of high frequency PCB.

SUMMARY OF THE INVENTION

An object of the invention is to provide a low dielectric material, which has excellent dielectric properties, low coefficient of thermal expansion and low water absorption.

To accomplish the above object, there is provided a low dielectric material, which comprises: (i) 5-50 parts by weight of polyphenylene ether (PPE) resin having a Mw of 1000~7000, a Mn of 1000-4000 and Mw/Mn=1.0-1.8; and (ii) 10-90 parts by weight of liquid crystal polymer with allyl group having a Mw of 1000~5000, a Mn of 1000-4000 and Mw/Mn=1.0-1.8, wherein the dielectric material has Dk of 3.4-4.0 and Df of 0.0025-0.0050.

In the low dielectric material of the invention, the low dielectric material further comprises 0.01-15 parts by weight of bismaleimide resins. In the low dielectric material of the invention, the low dielectric material further comprises 0.01-10 parts by weight of polymer additives.

In the low dielectric material of the invention, the polyphenylene ether resin is represented by the formula

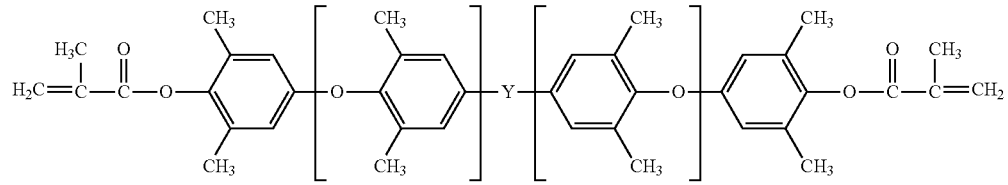

wherein Y represents at least one C, O and benzene ring or the combination.

In the low dielectric material of the invention, bismaleimide resins are selected from groups consisting of Phenylmethane maleimide

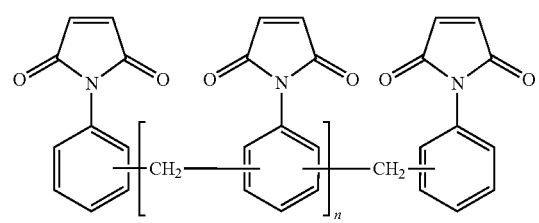

wherein n≥1;

Bisphenol A diphenyl ether bismaleimide

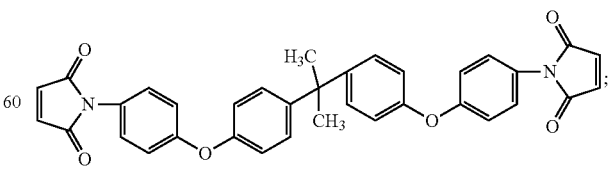

3,3'-dimethyl-5,5'-diethyl-4,4'-diphenylethane bismaleimide

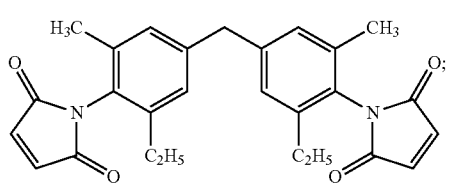 [SMILES: CCc1cc(Cc2cc(C)c(N3C(=O)C=CC3=O)c(CC)c2)cc(C)c1N1C(=O)C=CC1=O]

and
1,6-bismaleimide-(2,2,4-trimethyl)hexane.

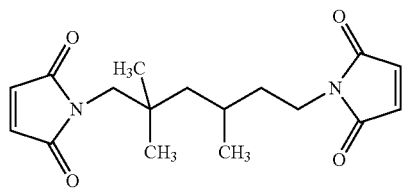 [SMILES: CC(CCN1C(=O)C=CC1=O)CC(C)(C)CN1C(=O)C=CC1=O]

In the low dielectric material of the invention, the polymer additives are selected from groups consisting of Homopolymers of Butadiene

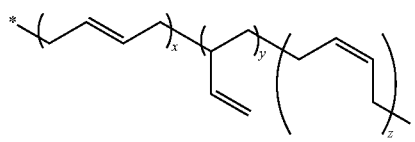

wherein y=70% and x+z=30%;
Random copolymers of butadiene and styrene

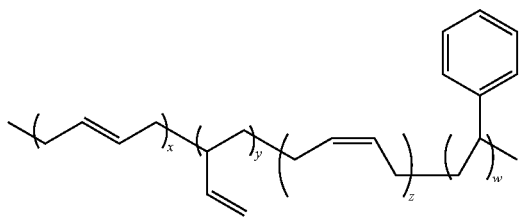

wherein y=30%, x+z=70% and w=≥1, and the amount of styrene=25 wt %;
Maleinized Polybutadiene

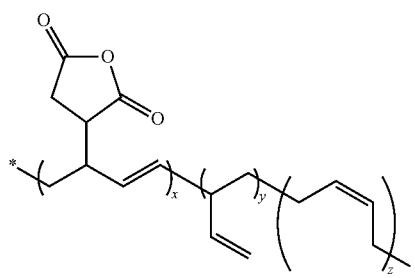

wherein y=28% and x+z=72%, the amount of maleic anhydride=8 wt %;
Butadiene-styrene-divinylbenzene copolymer; and Styrene Maleic Anhydride copolymer

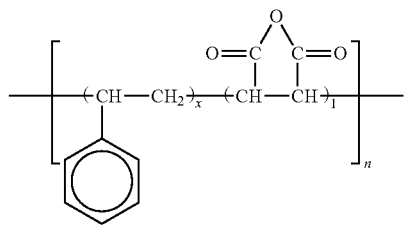

wherein X=1~8 and n≥1.

In the low dielectric material of the invention, it is preferable that crosslinking agent is added to increase crosslinking density of resins. The crosslinking agents with 40-80 parts by weight may be selected from the following groups consisting of

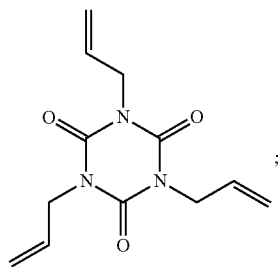

Triallyl isocyanurate (TAIC)

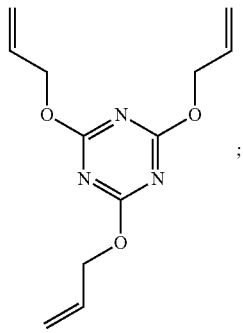

Triallyl cyanurate (TAC)

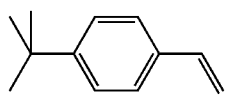

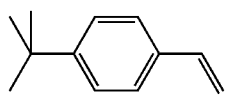

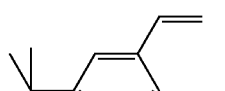

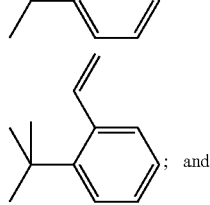

; and 4-tert-butylstyrene (TBS)

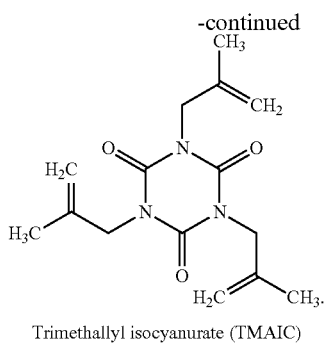

Trimethallyl isocyanurate (TMAIC)

In the low dielectric material of the invention, it is preferable that catalyst is added to increase reaction of crosslinking agents and other resins. The catalysts includes at least one peroxide having 116° C.-128° C. for a half life of 10 hours with 2-8 phr based on the total weight of PPE, BMI, polymer additives and crosslinking agents. The suitable peroxides comprise dicumyl peroxide, α,α'-bis(tert-butylperoxy)diisopropyl benzene and 2,5-di(tert-butylperoxy)-2,5-dimethyl-3-hexyne.

In the low dielectric material of the invention, it is preferable that filler is added to increase thermal conductivity and mechanical strength, and reduce thermal expansion. The suitable fillers may be fused silica, sphere-shaped silica, talc aluminum silicate and soft silica, e.g., siliesoft, wherein the soft silica can be used to reduce a drill bit wearing away when PCB is drilled to form holes by the drill bit. The soft silica has a particle size in a range of 0.5 µm-10 µm.

In order to increase flame retardation of the low dielectric material of the invention, halogen-containing flame retardants and flame retardants without halogen may be used. The halogen-containing flame retardants may comprise decabromodiphenyl ethane. The flame retardants without halogen may comprise phosphor-containing flame retardants and phosphates. The phosphor-containing flame retardants and phosphates are produced by ALBEMARLE CO., LTD.

The phosphates are like tetrakis(2,6-dimethylphenyl) 1,3-phenylene bisphosphate, HCA derivative (I), HCA derivative (II) and HCA derivative (III). The tetrakis(2,6-dimethylphenyl) 1,3-phenylene bisphosphate can be represented by the formula,

[OC$_6$H$_3$(CH$_3$)$_2$]$_2$P(O)OC$_5$H$_4$OP(O)[OC$_6$H$_3$(CH$_3$)$_2$]$_2$;

HCA derivative (I) having the following paradiphenyl phosphoryl dibenzyl structure:

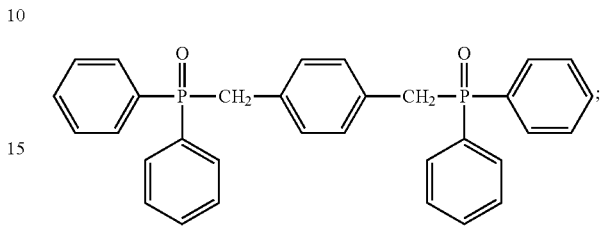

HCA derivative (II) having the following structure:

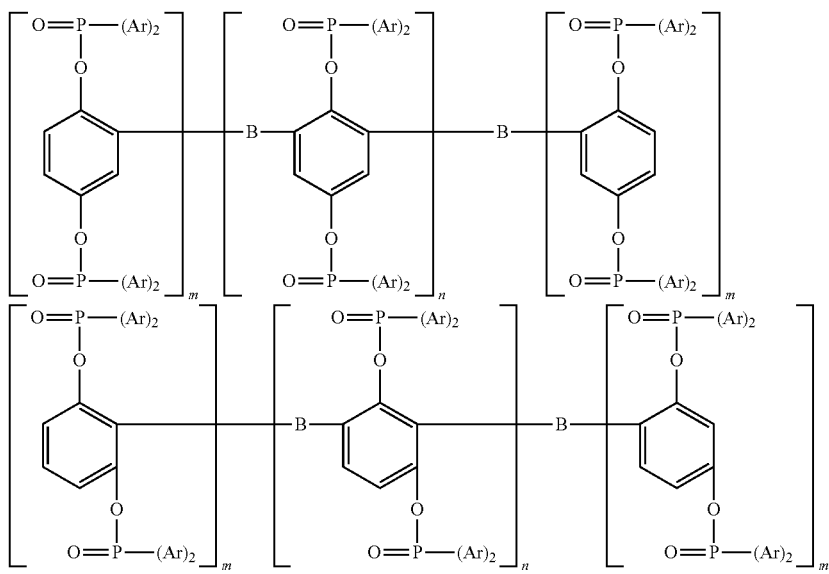

wherein with the proviso that when B is —CH$_2$—, —CH(CH$_3$)—, m is 1 and n is 1 to 3; with the proviso that when B is =CHCH=, m=2 and n=0; and HCA derivative (III) having the following structure (XP7866, Albemarle):

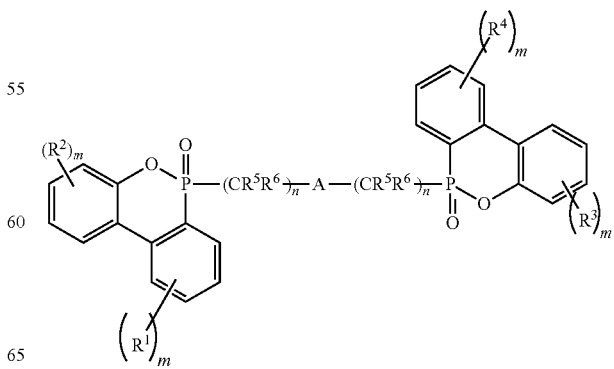

wherein A is a direct bond, $C_6$-$C_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl;

each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optional substituted by a $C_1$-$C_6$ alkyl;

each m is independently 1, 2, 3 or 4 each $R^5$ and $R^6$ are independently hydrogen or a $C_1$-$C_6$ alkyl;

each n is independently 0, 1, 2, 3, 4 or 5;

with the proviso that when A is aryl or a direct bond, n cannot be 0.

The foregoing and other objects, features and advantages of the present invention will be apparent to those skilled in the art from the following detailed description.

BRIEF DESCRIPTION OF THE DRAWINGS

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

The FIGURE shows a FTIR spectrum of liquid crystal polymer of an embodiment according to the present invention.

DETAILED DESCRIPTION OF THE INVENTION

In one aspect of the present invention, there is provided a thermal curable dielectric material to produce a prepreg in a successive process in the following examples 4-1 to 4-7. The process uses the dielectric material as a coating on a substrate which may be a fiberglass cloth. The apparatus for producing the prepreg includes a pasting tank wherein there are provided a plurality of rolls. The pasting tank is filled with the dielectric material. A roll of fiberglass cloth may enter the pasting tank and pass the plurality of rolls. The fiberglass cloth is sufficiently impregnated with the dielectric material, and then surplus dielectric material is removed by a metering roller. A heat treatment for curing the dielectric material and removing the solvent is required at 100° C. to 350° C. for 1 minute to 5 hours, preferably at 150° C. to 300° C. for 1 minute to 3 hours. The prepreg is obtained after the cured dielectric material is cooled down and the fiberglass cloth is wrapped.

A double-sided copper-clad laminate is produced by providing several prepregs in a neat stack between two electrodeposited copper foils, conducting a hot pressing process under 40 to 900 psi, raising temperature from 80° C. to 200° C. in 30 minutes, and then hot pressing at 200° C. for 120 minutes, and then cooling down to room temperature in 30 minutes in a vacuum pressing machine. The prepreg includes a fiberglass cloth of electrical grade 2116 and the dielectric material. Generally, a double-sided copper-clad laminate with a thickness of 1.0 mm is produced by providing 4 sheets of prepregs in a neat stack between two electrodeposited copper foils, with a thickness of 1.5 mm is produced by providing 7 sheets of prepregs, and with a thickness of 2.0 mm is produced by providing 10 sheets of prepregs.

The low dielectric material of the present invention may form a stable homogeneous solution in a solvent with a low boiling point. The properties of a copper-clad laminate with the dielectric material of the invention were determined including Tg, heat decomposition temperature, heat decomposition time, solder heat resistance (288° C.), thermal expansion coefficient, water absorption, thermal conductivity, dielectric constant, dielectric loss tangent and flammability according to IPC-TM-650 test method manual. The determining results show the copper-clad laminate with the dielectric material of the invention has high Tg, excellent dielectric properties such as Dk and Df, low water absorption, high thermal resistance and high thermal conductivity. The copper-clad laminate is suitable used as a substrate for electronic elements and IC package.

EXAMPLES

TABLE 1-1

INFLUENCE OF PPE RESIN AMOUNT

| EXAMPLE 4-1-1 | | AMOUNT OF PPE RESIN | | | | | | |
|---|---|---|---|---|---|---|---|---|
| | | C1 | C2 | C3 | C4 | C5 | C6 | C7 |
| PPE resin | SA9000 | 60 | 52.5 | 45 | 41 | 37.5 | 34 | 22.5 |
| BMI resin | 5100 | 15 | 15 | 15 | 15 | 15 | 15 | 15 |
| Polybutadiene | Ricon100 | 10 | 10 | 10 | 10 | 10 | 10 | 10 |
| Crosslinking agents | TAIC | 15 | 22.5 | 30 | 34 | 37.5 | 41 | 52.5 |
| Flame retardants | XP7866, phr | 20 | 20 | 20 | 20 | 20 | 20 | 20 |
| fillers | Fused silica, phr | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 206 | 224 | 229 | 221 | 212 | 213 | 212 |
| coefficient of thermal expansion (α1/α2), ppm/° C. | IPC-TM-650 2.4.24 | 58/334 | 60/305 | 56/251 | 53/247 | 56/211 | 61/204 | 55/245 |

TABLE 1-1-continued

INFLUENCE OF PPE RESIN AMOUNT

| EXAMPLE 4-1-1 | | C1 | C2 | C3 | C4 | C5 | C6 | C7 |
|---|---|---|---|---|---|---|---|---|
| | | \multicolumn{7}{c}{AMOUNT OF PPE RESIN} |
| water absorption | PCT/121° C./1 hr | 0.29 | 0.33 | 0.34 | 0.34 | 0.39 | 0.39 | 0.40 |
| 288° C. thermal resistance | Dip288° C. | >600 | >600 | >600 | >600 | >600 | >600 | >600 |
| Dk(2-10 GHz) | Cavity | 3.93 | 3.89 | 3.89 | 3.89 | 3.90 | 3.86 | 3.87 |
| Df(2-10 GHz) | Cavity | 0.0057 | 0.0054 | 0.0048 | 0.0044 | 0.0040 | 0.0040 | 0.0039 |
| flammability | UL94 | V-0 | V-0 | V-0 | V-0 | V-0 | V-0 | V-0 |

Tg, Dk and Df were compared with different ratio and amount of PPE. The Tg level may be affected by the amount of PPE used. Also, the amount of PPE may also have an effect on the Dk and Df value. When the amount of PPE is high, Dk and Df may be high. When the amount of PPE is low, Dk and Df may be low. Typically, a low value for the Dk and Df is preferred. In addition, the thermal expansion coefficient may be raised when PPE is added, and BMI is added to balance the effect. In Table 1-1, part number SA9000 of PPE with chemical name of Polyphenylene Oxide (PPO) or Polyphenylene Ether (PPE) is produced by Sabic CO., LTD.

TABLE 1-2

INFLUENCE OF LCP AMOUNT

| EXAMPLE 4-1-2 | | C8 | C9 | C10 | C11 | C12 | C13 |
|---|---|---|---|---|---|---|---|
| | | \multicolumn{6}{c}{AMOUNT OF LCP} |
| PPE resin | SA9000 | 48.5 | 27 | 5.4 | 13.5 | 13.5 | 13.5 |
| BMI resin | 5100 | 0 | 0 | 0 | 15 | 15 | 15 |
| Polybutadiene | Ricon100 | 0 | 0 | 0 | 10 | 10 | 10 |
| LCP | — | 10 | 50 | 90 | 50 | 50 | 50 |
| Crosslinking agents | TAIC | 41.5 | 23 | 4.6 | 11.5 | 11.5 | 11.5 |
| Flame retardants | HCA derivative (II), phr | 0 | 0 | 0 | 0 | 27 | 27 |
| | Decabromodiphenyl Ethane, phr | 11 | 14 | 18 | 12 | 0 | 0 |
| fillers | Fused silica, phr | 20 | 20 | 20 | 20 | 20 | 20 |
| catalysts | Peroxide 119° C. for a half life of 10 hrs | 2.5 | 2.5 | 2.5 | 2.5 | 2.5 | 2.5 |
| | Imidozole, phr | 0.1 | 0.5 | 0.9 | 0.5 | 0.5 | 0.5 |
| Tg, TMA, ° C. | IPC-TM-650 2.4.24.3 | 193 | 219 | 205 | 225 | 230 | 227 |
| coefficient of thermal expansion ($\alpha1/\alpha2$), ppm/° C. | IPC-TM-650 2.4.24 | 49/244 | 45/232 | 47/250 | 44/240 | 56/231 | 59/245 |
| water absorption | PCT/121° C./1 hr | 0.30 | 0.31 | 0.33 | 0.32 | 0.34 | 0.31 |
| 288° C. thermal resistance | Dip288° C. | >600 | >600 | >600 | >600 | >600 | >600 |
| Dk(2-10 GHz) | Cavity | 3.95 | 3.94 | 3.96 | 3.9 | 3.91 | 3.41 |
| Df(2-10 GHz) | Cavity | 0.0041 | 0.0045 | 0.0046 | 0.0042 | 0.0041 | 0.0026 |
| flammability | UL94 | V-0 | V-0 | V-0 | V-0 | V-0 | V-0 |

Liquid crystal polymers generally exhibit good chemical, moisture and temperature resistance, and good mechanical strength, and can be formed into thin films that have a high degree of structural integrity. However, the cost and/or the dielectric constant of a film made solely of LCP may be too high for certain electronic applications.

The liquid crystal polymer according to the present invention is selected from a liquid crystalline polymer (or a thermoplastic polymer capable of forming an optically anisotropic melt phase) processable in a molten state. Chemical formulation of the liquid crystal polymer is not particularly limited to a specific one as long as it is a liquid crystalline polymer that can be melt-processable, and examples thereof may include a thermoplastic liquid crystal polymer of vinyl type, a thermoplastic liquid crystal aromatic polyamide, or a thermoplastic liquid crystal aromatic polyester, and preferably, modified by introducing allyl group at terminals and/or side ends thereto. The liquid crystal polymer of the present invention can carry out free radical reaction to form an interpenetrating polymer network by the allyl group. In Table 1-2, Example 13 uses low Dk glass fiber, and Example 8 and Example 9 use E-glass fiber.

The thermoplastic liquid crystal polymer of vinyl type has the following structure:

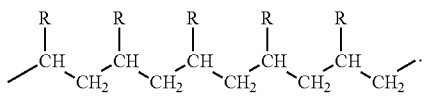

The thermoplastic liquid crystal aromatic polyamide has the following structure:

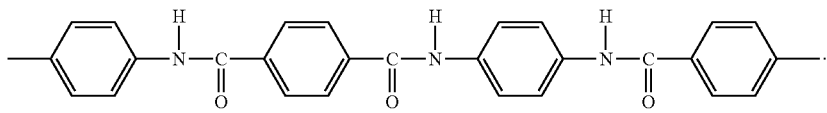

The liquid crystal polymer of the present invention has FTIR spectrum shown as the FIGURE Peak 3472 cm$^{-1}$ relates to —OH or —NH stretch. Peak 3097 cm$^{-1}$ relates to Vinyl or —CH2 asymmetric stretch. Peaks 2950 cm–1, 2919–1 cm, 2874 cm–1 and 2842 cm–1 relate to —C≡C—H, —C═CH2, —C—CH3 or

Peaks 1730 cm–1 and 1715 cm–1 relate to aromatic ester, C═O stretch, saturated C═O stretch or aromatic C═O. Peaks 1640 cm–1 and 1605 cm–1 relate to —C═C or ring mode C═C. Peaks 1640 cm–1, 1570 cm–1 and 1482 cm–1 relate to —NH bending or asymmetric

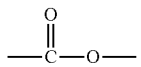

stretch. Peaks 1459 cm–1 and 1377 cm–1 relate to

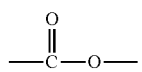

symmetric stretch. Peaks 1299 cm–1, 1244 cm–1, 1188 cm–1, 1153 cm–1, 1043 cm–1 and 1023 cm–1 relate to —C—O—, —C—O—C— or —C—C—C—. Peaks 1377 cm–1 to 1023 cm–1 relate to amide, imide, —CN stretch. Peaks 827 cm–1 to 691 cm–1 relate to —C═C— on benzene ring, para or meta substituted phenyl or —NH out of plane wagging or mono. It can be found from the FIGURE that peaks identify the thermoplastic liquid crystal polymer of vinyl type and the thermoplastic liquid crystal aromatic polyamide.

TABLE 2

| | INFLUENCE OF BMI RESIN SPECIES AND AMOUNT | | | | | | | | |
|---|---|---|---|---|---|---|---|---|---|
| | | BMI RESIN | | | | | | | |
| EXAMPLE 4-2 | | A1 | A2 | A3 | A4 | A5 | A6 | A7 | A8 |
| PPE resin | SA9000 | 42.5 | 40 | 37.5 | 35 | 32.5 | 37.5 | 37.5 | 37.5 |
| BMI resin | 2300 | 0 | 0 | 0 | 0 | 0 | 0 | 15 | 0 |
| | 4000 | 0 | 0 | 0 | 0 | 0 | 15 | 0 | 0 |
| | 5100 | 5 | 10 | 15 | 20 | 25 | 0 | 0 | 0 |
| | TMH | 0 | 0 | 0 | 0 | 0 | 0 | 0 | 15 |
| Polybutadiene | Ricon100 | 10 | 10 | 10 | 10 | 10 | 10 | 10 | 10 |
| Crosslinking agents | TAIC | 42.5 | 40 | 37.5 | 35 | 32.5 | 37.5 | 37.5 | 37.5 |
| Flame retardants | XP7866, phr | 20 | 20 | 20 | 20 | 20 | 20 | 20 | 20 |
| fillers | Fused silica, phr | 20 | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 | 2.5 |
| Tg, TMA | IPC-TM-650 2.4.24.3 | 210 | 212 | 212 | 211 | 211 | 212 | 222 | 195 |
| Coefficient of thermal expansion (α1/α2), ppm/° C. | IPC-TM-650 2.4.24 | 60/296 | 58/250 | 56/211 | 54/207 | 50/197 | 55/260 | 45/170 | 45/288 |

TABLE 2-continued

INFLUENCE OF BMI RESIN SPECIES AND AMOUNT

| | | | | | | | | | |
|---|---|---|---|---|---|---|---|---|---|
| water absorption | PCT/121° C./1 hr | 0.30 | 0.34 | 0.39 | 0.44 | 0.46 | 0.41 | 0.47 | 0.33 |
| 288° C. thermal resistance | Dip288° C. | >600 | >600 | >600 | >600 | >600 | >600 | >600 | >600 |
| Dk(2-10 GHz) | Cavity | 3.85 | 3.87 | 3.90 | 3.94 | 3.98 | 3.91 | 3.93 | 3.86 |
| Df(2-10 GHz) | Cavity | 0.0040 | 0.0041 | 0.0040 | 0.0042 | 0.0043 | 0.0042 | 0.0046 | 0.0041 |
| flammability | UL94 | V-0 | V-0 | V-0 | V-0 | V-0 | V-1 | V-0 | V-0 |

| | | BMI RESIN | | | | | | | |
|---|---|---|---|---|---|---|---|---|---|
| | EXAMPLE 4-2 | A9 | A10 | A11 | A12 | A13 | A14 | A15 | Comparative example |
| PPE resin | SA9000 | 37 | 37 | 37 | 37 | 37 | 37.5 | 37 | 50 |
| BMI resin | 2300 | 8 | 0 | 8 | 0 | 0 | 5 | 4 | 0 |
| | 4000 | 8 | 8 | 0 | 8 | 0 | 5 | 4 | 0 |
| | 5100 | 0 | 8 | 0 | 0 | 8 | 5 | 4 | 0 |
| | TMH | 0 | 0 | 8 | 8 | 8 | 0 | 4 | 0 |
| Polybutadiene | Ricon 100 | 10 | 10 | 10 | 10 | 10 | 10 | 10 | 0 |
| Crosslinking agents | TAIC | 37 | 37 | 37 | 37 | 37 | 37.5 | 37 | 50 |
| Flame retardants | XP7866, phr | 20 | 20 | 20 | 20 | 20 | 20 | 20 | 20 |
| fillers | Fused silica, phr | 20 | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 | 2.5 |
| Tg, TMA | IPC-TM-650 2.4.24.3 | 208 | 204 | 205 | 200 | 214 | 210 | 207 | 218 |
| Coefficient of thermal expansion ($\alpha 1/\alpha 2$), ppm/° C. | IPC-TM-650 2.4.24 | 50/210 | 57/278 | 45/230 | 52/268 | 54/290 | 53/240 | 49/225 | 64/325 |
| water absorption | PCT/121° C./1 hr | 0.43 | 0.42 | 0.41 | 0.36 | 0.44 | 0.40 | 0.39 | 0.33 |
| 288° C. thermal resistance | Dip288° C. | >600 | >600 | >600 | >600 | >600 | >600 | >600 | >600 |
| Dk(2-10 GHz) | Cavity | 3.96 | 3.91 | 3.90 | 3.87 | 3.89 | 3.91 | 3.90 | 3.80 |
| Df(2-10 GHz) | Cavity | 0.0041 | 0.0041 | 0.0045 | 0.004 | 0.0039 | 0.0041 | 0.0043 | 0.0044 |
| flammability | UL94 | V-0 | V-0 | V-0 | V-0 | V-0 | V-0 | V-0 | V-0 |

The coefficient of thermal expansion was measured with different species and amount of BMI resin. The more the amount of BMI resin is, the lower the coefficient of thermal expansion is. In the example, there are three kinds of comparison comprising three groups that A1-A5 shows different amount of BMI with the same species, A6-A8 shows the same amount of BMI with different species and A9-A15 shows about the same total amount of BMI with more than two species. In Table 2, part numbers 2300, 4000, 5100 and TMH of BMI are produced by Daiwakasei Industry CO., LTD, in which part number 2300 has chemical name of phenyl methane maleimide, part number 4000 has chemical name of 2,2'-bis[4-(4-maleimidophenoxy)phenyl] propane, part number 5100 has chemical name of 3,3'-dimethyl-5,5'-diethyl-4,4'-diphenylmethane bismaleimide and part number TMH has chemical name of 1,6'-bismaleimide-(2,2,4-trimethyl)hexane.

It can be found from group A1-A5 that by increasing the amount of BMI resin, the thermal expansion coefficient would decrease. However, by increasing the amount of BMI resin, the water absorption would also increase. As to group A6-A8, different BMI resins may reduce the thermal expansion coefficient, but would also affect the water absorption. Regarding group A9-A15, different combination of BMI resins may reduce the thermal expansion coefficient, and affect the water absorption also. In the invention, the object of addition of BMI to the dielectric material is to reduce the thermal expansion coefficient. However, the more the amount of BMI resin is, the higher the water absorption is. Therefore, the polymer additives are added to reduce the water absorption.

TABLE 3

INFLUENCE OF POLYMER ADDITIVES SPECIES AND AMOUNT

| EXAMPLE 4-3 | | B1 | B2 | B3 | B4 | B5 | B6 | B7 |
|---|---|---|---|---|---|---|---|---|
| PPE resin | SA9000 | 40 | 37.5 | 35 | 32.5 | 30 | 37.5 | 37.5 |
| BMI resin | 5100 | 15 | 15 | 15 | 15 | 15 | 15 | 15 |
| Polybutadiene | Ricon100 | 5 | 10 | 15 | 20 | 25 | 0 | 0 |
| | Ricon130MA8 | 0 | 0 | 0 | 0 | 0 | 10 | 0 |
| | Ricon150 | 0 | 0 | 0 | 0 | 0 | 0 | 10 |
| | Ricon257 | 0 | 0 | 0 | 0 | 0 | 0 | 0 |
| SMA | S:M = 3:1 | 0 | 0 | 0 | 0 | 0 | 0 | 0 |
| | S:M = 4:1 | 0 | 0 | 0 | 0 | 0 | 0 | 0 |
| | S:M = 5:1 | 0 | 0 | 0 | 0 | 0 | 0 | 0 |
| | S:M = 6:1 | 0 | 0 | 0 | 0 | 0 | 0 | 0 |
| | S:M = 8:1 | 0 | 0 | 0 | 0 | 0 | 0 | 0 |
| Crosslinking agents | TAIC | 40 | 37.5 | 35 | 32.5 | 30 | 37.5 | 37.5 |
| Flame retardant | XP7866, phr | 20 | 20 | 20 | 20 | 20 | 20 | 20 |
| Fillers | Fused silica, phr | 20 | 20 | 20 | 20 | 20 | 20 | 20 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 221 | 212 | 200 | 194 | 186 | 213 | 217 |
| coefficient of thermal expansion ($\alpha1/\alpha2$), ppm/° C. | IPC-TM-650 2.4.24 | 53/201 | 56/211 | 64/220 | 67/260 | 74/300 | 58/265 | 57/270 |
| water absorption | PCT/121° C./1 hr | 0.43 | 0.39 | 0.35 | 0.32 | 0.28 | 0.45 | 0.43 |
| 288° C. thermal resistance | Dip288° C. | >600 | >600 | >600 | >600 | >600 | >600 | >600 |
| Dk(2-10 GHz) | Cavity | 3.93 | 3.90 | 3.87 | 3.86 | 3.84 | 3.92 | 3.90 |
| Df(2-10 GHz) | Cavity | 0.0043 | 0.0040 | 0.0041 | 0.0040 | 0.0039 | 0.0045 | 0.0044 |
| flammability | UL94 | V-0 | V-0 | V-0 | V-1 | V-1 | V-0 | V-0 |

| EXAMPLE 4-3 | | B9 | B10 | B11 | B12 | B13 | Comparative example |
|---|---|---|---|---|---|---|---|
| PPE resin | SA9000 | 37.5 | 37.5 | 37.5 | 37.5 | 37.5 | 42.5 |
| BMI resin | 5100 | 15 | 15 | 15 | 15 | 15 | 15 |
| Polybutadiene | Ricon100 | 0 | 0 | 0 | 0 | 0 | 0 |
| | Ricon130MA8 | 0 | 0 | 0 | 0 | 0 | 0 |
| | Ricon150 | 0 | 0 | 0 | 0 | 0 | 0 |
| | Ricon257 | 0 | 0 | 0 | 0 | 0 | 0 |
| SMA | S:M = 3:1 | 10 | 0 | 0 | 0 | 0 | 0 |
| | S:M = 4:1 | 0 | 10 | 0 | 0 | 0 | 0 |
| | S:M = 5:1 | 0 | 0 | 10 | 0 | 0 | 0 |
| | S:M = 6:1 | 0 | 0 | 0 | 10 | 0 | 0 |
| | S:M = 8:1 | 0 | 0 | 0 | 0 | 10 | 0 |
| Crosslinking agents | TAIC | 37.5 | 37.5 | 37.5 | 37.5 | 37.5 | 42.5 |
| Flame retardants | XP7866, phr | 20 | 20 | 20 | 20 | 20 | 20 |
| fillers | Fused silica, phr | 20 | 20 | 20 | 20 | 20 | 20 |
| catalysts | Peroxide 119° C. for a half life of 10 hrs | 2.5 | 2.5 | 2.5 | 2.5 | 2.5 | 2.5 |
| Tg, TMA | IPC-TM-650 2.4.24.3 | 220 | 215 | 210 | 206 | 195 | 222 |
| coefficient of thermal expansion ($\alpha1/\alpha2$), ppm/° C. | IPC-TM-650 2.4.24 | 45/232 | 48/237 | 50/245 | 51/240 | 53/260 | 45/200 |
| water absorption | PCT/121° C./1 hr | 0.46 | 0.45 | 0.43 | 0.43 | 0.40 | 0.56 |
| 288° C. thermal resistance | Dip288° C. | >600 | >600 | >600 | >600 | >600 | >600 |
| Dk(2-10 GHz) | Cavity | 3.95 | 3.95 | 3.93 | 3.91 | 3.90 | 3.93 |
| Df(2-10 GHz) | Cavity | 0.0085 | 0.0073 | 0.0064 | 0.0056 | 0.0042 | 0.0043 |
| flammability | UL94 | V-0 | V-0 | V-0 | V-0 | V-0 | V-0 |

The water absorption was measured with different species and amount of polymer additives. Polybutadiene (PB) and styrene-maleic anhydride (SMA) were used as the polymer additives in the invention. It can be found from using the different amount of PB with the same species that by increasing the amount of PB, the water absorption would decrease. However, with the increasing amount of PB, the coefficient of thermal expansion would also increase. As to using different species of PB in combination with SMA, it shows SMA can reduce the water absorption and the coefficient of thermal expansion, but Df may remain high. However, PB can be used to reduce Df In Table 3, part numbers Ricon100, Ricon130MA8, Ricon150 and Ricon257 of PB are produced by Sartomer CO., LTD, in which part number Ricon100 has chemical name of butadiene styrene copolymer, part number Ricon130MA8 has chemical name of butadiene adducted with maleic anhydride, part number Ricon 150 has chemical name of polybutadiene resin and Ricon 257 has chemical name of polybutadiene grafted with styrene and benzene in toluene solution. In Table 3, SMA with S:M=3:1 indicates that the ratio of styrene to maleic anhydride is 3 to 1. Generally, the ratios are about 1:1~12:1.

TABLE 4

INFLUENCE OF DIFFERENT SPECIES OF CROSSLINKING AGENTS

| | | CROSSLINKING AGENT | | | | |
|---|---|---|---|---|---|---|
| EXAMPLE 4-4 | | D1 | D2 | D3 | D4 | D5 |
| PPE resin | SA9000 | 37.5 | 37.5 | 37.5 | 37.5 | 37.5 |
| BMI resin | 5100 | 15 | 15 | 15 | 15 | 15 |
| polybutadiene | Ricon100 | 10 | 10 | 10 | 10 | 10 |
| Crosslinking agents | TAC | 37.5 | 0 | 0 | 0 | 0 |
| | TAIC | 0 | 37.5 | 0 | 0 | 0 |
| | TBS | 0 | 0 | 37.5 | 0 | 0 |
| | TMAIC | 0 | 0 | 0 | 37.5 | 37.5 |
| Flame retardants | XP7866, phr | 20 | 20 | 20 | 0 | 0 |
| | Decabromodiphenyl Ethane, phr | 0 | 0 | 0 | 10 | 0 |
| | HCA derivative (II), phr | 0 | 0 | 0 | 0 | 20 |
| fillers | Fused silica, phr | 20 | 20 | 20 | 20 | 20 |
| catalysts | Peroxide 119° C. for a half life of 10 hrs | 2.5 | 2.5 | 2.5 | 4 | 4 |
| Tg, TMA | IPC-TM-650 2.4.24.3 | 183 | 212 | 202 | 188 | 183 |
| coefficient of thermal expansion ($\alpha 1/\alpha 2$), ppm/° C. | IPC-TM-650 2.4.24 | 59/273 | 56/211 | 50/250 | 49/267 | 50/235 |
| water absorption | PCT/121° C./1 hr | 0.39 | 0.39 | 0.12 | 0.35 | 0.30 |
| 288° C. thermal resistance | Dip288° C. | >600 | >600 | >600 | >600 | >600 |
| Dk(2-10 GHz) | Cavity | 3.95 | 3.90 | 3.75 | 3.86 | 3.91 |
| Df(2-10 GHz) | Cavity | 0.0039 | 0.0040 | 0.0035 | 0.004 | 0.0038 |
| flammability | UL94 | V-0 | V-0 | V-0 | V-0 | V-0 |

The dielectric material of the invention may comprise at least one crosslinking agent with 40-80 parts by weight selected from the following groups consisting of Triallyl cyanurate (TAC), Triallyl isocyanurate (TAIC), 4-tert-butyl-styrene and TMAIC. The properties of a copper-clad laminate with the dielectric material of the invention were measured with different species of crosslinking agents. It can be found by using TAC that Tg and the coefficient of thermal expansion were poor, and water absorption, Dk and Df were of ordinary level. As to TAIC, all the properties of a copper-clad laminate with the dielectric material of the invention were of ordinary level. However, one drawback with TAIC is that it is volatile during hot press cycle. The use of TMAIC can effectively improve the high volatility of TAIC because TMAIC has a high melting point and does not evaporated easily, while maintaining the properties to its ordinary level. Regarding 4-tert-butylstyrene, the coefficient of thermal expansion, water absorption and Df were excellent, but Dk is low.

TABLE 5

INFLUENCE OF DIFFERENT SPECIES OF FLAME RETARDANTS

| | | FLAME RETARDANTS | | | | | |
|---|---|---|---|---|---|---|---|
| EXAMPLE 4-5 | | E1 | E2 | E3 | E4 | E5 | E6 |
| PPE resin | SA9000 | 37.5 | 37.5 | 37.5 | 37.5 | 37.5 | 37.5 |
| BMI resin | 5100 | 15 | 15 | 15 | 15 | 15 | 15 |
| polybutadiene | Ricon100 | 10 | 10 | 10 | 10 | 10 | 10 |
| Crosslinking agents | TAIC | 37.5 | 37.5 | 37.5 | 37.5 | 37.5 | 37.5 |
| Flame retardants | Decabromodiphenyl Ethane, phr | 10 | 0 | 0 | 0 | 0 | 0 |
| | XP7866, phr | 0 | 20 | 15 | 10 | 0 | 0 |
| | Tetrakis(2,6-dimethylphenyl) 1,3-phenylene bisphosphate, phr | 0 | 0 | 5 | 10 | 0 | 0 |
| | HCA derivative (II), phr | 0 | 0 | 0 | 0 | 20 | 0 |
| | DPO, phr | 0 | 0 | 0 | 0 | 0 | 20 |

TABLE 5-continued

INFLUENCE OF DIFFERENT SPECIES OF FLAME RETARDANTS

| | EXAMPLE 4-5 | FLAME RETARDANTS | | | | | |
|---|---|---|---|---|---|---|---|
| | | E1 | E2 | E3 | E4 | E5 | E6 |
| fillers | Fused silica, phr | 20 | 20 | 20 | 20 | 20 | 20 |
| catalysts | Peroxide 119° C. for a half life of 10 hrs | 2.5 | 2.5 | 2.5 | 2.5 | 2.5 | 2.5 |
| Tg, TMA | IPC-TM-650 2.4.24.3 | 224 | 212 | 226 | 180 | 214 | 224 |
| coefficient of thermal expansion ($\alpha 1/\alpha 2$), ppm/° C. | IPC-TM-650 2.4.24 | 55/233 | 56/211 | 65/267 | 67/339 | 50/210 | 45/170 |
| water absorption | PCT/121° C./1 hr | 0.43 | 0.39 | 0.37 | 0.30 | 0.36 | 0.25 |
| 288° C. thermal resistance | Dip288° C. | >60 | >600 | >600 | >600 | >600 | >600 |
| Dk(2-10 GHz) | Cavity | 3.83 | 3.90 | 3.87 | 3.85 | 3.89 | 3.88 |
| Df(2-10 GHz) | Cavity | 0.0043 | 0.0040 | 0.0040 | 0.0037 | 0.0036 | 0.0038 |
| flammability | UL94 | V-0 | V-0 | V-0 | V-0 | V-0 | V-0 |

If desired, the dielectric material of the invention may optionally comprise flame retardants. A halogen-containing flame retardant of decabromodiphenyl ethane with 7-15 phr based on the total weight of PPE, BMI, polymer additives and crosslinking agents may be added to the dielectric material of the invention. The dielectric material of the invention may comprise at least one flame retardant without halogen with 12-14 phr based on the total weight of PPE, BMI, polymer additives and crosslinking agents selected from the following groups consisting of phosphor-containing flame retardants and phosphates. The phosphor-containing flame retardants and phosphates are produced by ALBEMARLE CO., LTD, wherein HCA derivative (III) having product name of XP7866 comprises organic fillers, 10-15% phosphor. XP7866 has a particle size in a range of 0.5 µm-60 µm. The phosphates are like tetrakis(2,6-dimethylphenyl) 1,3-phenylene bisphosphate.

TABLE 6

INFLUENCE OF DIFFERENT SPECIES OF FILLERS

| | EXAMPLES 4-6 | FILLERS | | | | | | |
|---|---|---|---|---|---|---|---|---|
| | | F1 | F2 | F3 | F4 | F5 | F6 | F7 |
| PPE resin | SA9000 | 37.5 | 37.5 | 37.5 | 37.5 | 37.5 | 37.5 | 37.5 |
| BMI resin | 5100 | 15 | 15 | 15 | 15 | 15 | 15 | 15 |
| polybutadiene | Ricon100 | 10 | 10 | 10 | 10 | 10 | 10 | 10 |
| Crosslinking agents | TAIC | 37.5 | 37.5 | 37.5 | 37.5 | 37.5 | 37.5 | 37.5 |
| Flame retardants | XP7866, phr | 20 | 20 | 20 | 20 | 20 | 20 | 20 |
| fillers | Fused silica, phr | 0 | 20 | 10 | 10 | 30 | 25 | 45 |
| | Siliesoft, phr | 0 | 0 | 0 | 0 | 0 | 0 | 0 |
| | Ball type silica | 20 | 0 | 10 | 0 | 0 | 0 | 0 |
| catalysts | Peroxide 119° C. for a half life of 10 hrs | 2.5 | 2.5 | 2.5 | 2.5 | 2.5 | 2.5 | 2.5 |
| Tg, TMA | IPC-TM-650 2.4.24.3 | 210 | 212 | 214 | 220 | 208 | 215 | 195 |
| coefficient of thermal expansion ($\alpha 1/\alpha 2$), ppm/° C. | IPC-TM-650 2.4.24 | 53/220 | 56/211 | 52/225 | 58/260 | 45/210 | 50/220 | 40/205 |
| water absorption | PCT/121° C./1 hr | 0.41 | 0.39 | 0.40 | 0.39 | 0.38 | 0.40 | 0.36 |
| 288° C. thermal resistance | Dip288° C. | >600 | >600 | >600 | >600 | >600 | >600 | >600 |
| Dk(2-10 GHz) | Cavity | 3.87 | 3.90 | 3.88 | 3.85 | 3.96 | 4.01 | 4.06 |
| Df(2-10 GHz) | Cavity | 0.0039 | 0.0040 | 0.0040 | 0.0040 | 0.0041 | 0.0043 | 0.0045 |
| flammability | UL94 | V-0 | V-0 | V-0 | V-0 | V-0 | V-0 | V-0 |
| Frequency of changing drill bit | Drill holes count | 500 | 300 | 400 | — | — | — | — |

TABLE 6-continued

INFLUENCE OF DIFFERENT SPECIES OF FILLERS

| EXAMPLES 4-6 | | FILLERS F8 | F9 |
|---|---|---|---|
| PPE resin | SA9000 | 37.5 | 37.5 |
| BMI resin | 5100 | 15 | 15 |
| polybutadiene | Ricon100 | 10 | 10 |
| Crosslinking agents | TAIC | 37.5 | 37.5 |
| Flame retardants | XP7866, phr | 20 | 20 |
| Fillers | Fused silica, phr | 0 | 0 |
| | Siliesoft, phr | 10 | 20 |
| | Ball type silica, phr | 10 | 0 |
| catalysts | Peroxide 119° C. for a half life of 10 hrs | 2.5 | 2.5 |
| Tg, TMA | IPC-TM-650 2.4.24.3 | 206 | 210 |
| coefficient of thermal expansion ($\alpha 1/\alpha 2$), ppm/° C. | IPC-TM-650 2.4.24 | 50/217 | 51/222 |
| water absorption | PCT/121° C./1 hr | 0.36 | 0.40 |
| 288° C. thermal resistance | Dip288° C. | >600 | >600 |
| Dk(2-10 GHz) | Cavity | 3.90 | 3.95 |
| Df(2-10 GHz) | Cavity | 0.0053 | 0.0060 |
| flammability | UL94 | V-0 | V-0 |
| Frequency of changing drill bit | Drill holes count | 600 | 800 |

The low dielectric material of the invention may optionally comprise fillers. The suitable fillers such as fused silica, sphere-shaped silica and soft silica, e.g., siliesoft may be used, wherein the soft silica can be used to reduce a drill bit wearing away when PCB is drilled to form holes by the drill bit, comparing Examples F1-F3 with Examples F8-F9. The soft silica has a particle size in a range of 0.5 μm-10 μm. The suitable amount of filler is 8-50 phr based on the total weight of PPE, BMI, polymer additives and crosslinking agents. It can be found from the fused silica and the sphere-shaped silica with the same amount that the sphere-shaped silica has lower Dk and Df than the fused silica.

TABLE 7

INFLUENCE OF DIFFERENT AMOUNT AND SPECIES OF CATALYSTS

| EXAMPLE 4-7 | | CATALYSTS G1 | G2 | G3 | G4 |
|---|---|---|---|---|---|
| PPE resin | SA9000 | 37.5 | 37.5 | 37.5 | 37.5 |
| BMI resin | 5100 | 15 | 15 | 15 | 15 |
| polybutadiene | Ricon100 | 10 | 10 | 10 | 10 |
| Crosslinking agents | TAIC | 37.5 | 37.5 | 37.5 | 37.5 |
| Flame retardants | XP7866, phr | 20 | 20 | 20 | 20 |
| fillers | Ball type silica | 20 | 20 | 20 | 20 |
| catalysts | Peroxide 116° C. for a half life of 10 hrs | 0 | 0 | 0 | 0 |
| | Peroxide 119° C. for a half life of 10 hrs | 2.5 | 3 | 7 | 8 |
| | Peroxide 128° C. for a half life of 10 hrs | 0 | 0 | 0 | 0 |
| Tg, TMA | IPC-TM-650 2.4.24.3 | 212 | 220 | 222 | 227 |
| coefficient of thermal expansion ($\alpha 1/\alpha 2$), ppm/° C. | IPC-TM-650 2.4.24 | 56/211 | 53/225 | 49/220 | 50/180 |
| water absorption | PCT/121° C./1 hr | 0.39 | 0.43 | 0.47 | 0.60 |
| 288° C. thermal resistance | Dip288° C. | >600 | >600 | >600 | >600 |
| Dk(2-10 GHz) | Cavity | 3.90 | 3.91 | 3.90 | 3.96 |
| Df(2-10 GHz) | Cavity | 0.0040 | 0.0042 | 0.0045 | 0.0049 |
| flammability | UL94 | V-0 | V-0 | V-0 | V-0 |

TABLE 7-continued

INFLUENCE OF DIFFERENT AMOUNT AND SPECIES OF CATALYSTS

| | EXAMPLE 4-7 | CATALYSTS | | | | |
|---|---|---|---|---|---|---|
| | | G5 | G6 | G7 | G8 | G9 |
| PPE resin | SA9000 | 37.5 | 37.5 | 37.5 | 37.5 | 37.5 |
| BMI resin | 5100 | 15 | 15 | 15 | 15 | 15 |
| polybutadiene | Ricon100 | 10 | 10 | 10 | 10 | 10 |
| Crosslinking agents | TAIC | 37.5 | 37.5 | 37.5 | 37.5 | 37.5 |
| Flame retardants | XP7866, phr | 20 | 13 | 13 | 13 | 13 |
| fillers | Ball type silica | 20 | 13 | 13 | 13 | 13 |
| catalysts | Peroxide 116° C. for a half life of 10 hrs | 2.5 | 0 | 1.5 | 1.5 | 1 |
| | Peroxide 119° C. for a half life of 10 hrs | 0 | 0 | 0 | 1.5 | 1 |
| | Peroxide 128° C. for a half life of 10 hrs | 0 | 2.5 | 1.5 | 0 | 1 |
| Tg, | IPC-TM-650 2.4.24.3 | 208 | 225 | 220 | 209 | 215 |
| TMA coefficient of thermal expansion (α1/α2), ppm/° C. | IPC-TM-650 2.4.24 | 57/230 | 50/230 | 47/226 | 52/220 | 50/235 |
| water absorption | PCT/121° C./1 hr | 0.42 | 0.38 | 0.40 | 0.42 | 0.38 |
| 288° C. thermal resistance | Dip288° C. | >600 | >600 | >600 | >600 | >600 |
| Dk(2-10 GHz) | Cavity | 3.88 | 3.91 | 3.92 | 3.93 | 3.91 |
| Df(2-10 GHz) | Cavity | 0.0039 | 0.0040 | 0.0041 | 0.0042 | 0.0039 |
| flammability | UL94 | V-0 | V-0 | V-0 | V-0 | V-0 |

The low dielectric material of the invention may optionally comprise catalysts including peroxides having 116° C.-128° C. for a half life of 10 hours. The suitable amount of peroxide is 2-8 phr based on the total weight of PPE, BMI, polymer additives and crosslinking agents. The preferable catalyst is a peroxide having 119° C. for a half life of 10 hours.

The low dielectric material of the invention may comprise PPE, but not comprise epoxy resin. The desired values of Dk and/or Df cannot be obtained, if epoxy resin is added to the dielectric material of the invention. When reacting epoxy resin with the dielectric material of the invention, the open rings of the epoxy resin may produce excess OH groups, therefore causing the Dk and Df value to remain high and unable to decrease.

What is claimed is:

1. A low dielectric material comprising:
   (i) 5-50 parts by weight of polyphenylene ether (PPE) resin having a Mw of 1000-7000, a Mn of 1000-4000 and Mw/Mn=1.0-1.8; wherein polyphenylene ether resin is represented by the formula

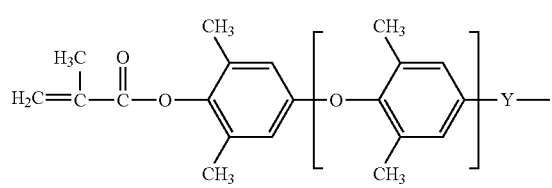

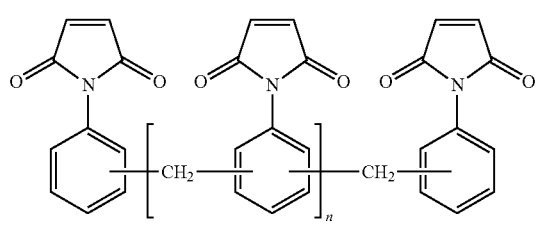

wherein Y represents at least one C, O and benzene ring or the combination; and
   (ii) 10-90 parts by weight of liquid crystal polymer with allyl group having a Mw of 1000-5000, a Mn of 1000-4000 and Mw/Mn=1.0-1.8, wherein the dielectric material has Dk of 3.4-4.0 and Df of 0.0025-0.0050.

2. The low dielectric material of claim 1, further comprising 0.01-15 parts by weight of bismaleimide resins.

3. The low dielectric material of claim 1, further comprising 0.01-10 parts by weight of polymer additives.

4. The low dielectric material of claim 2, wherein the bismaleimide resins are selected from groups consisting of phenylmethane maleimide wherein n≥1;

bisphenol A diphenyl ether bismaleimide

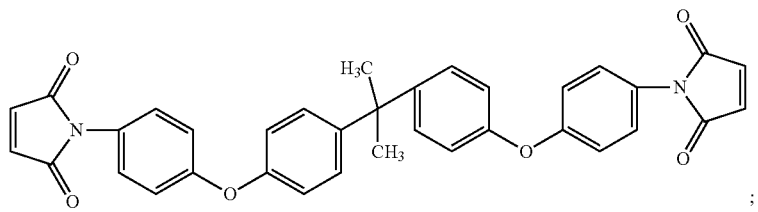 [SMILES: CC(C)(c1ccc(Oc2ccc(N3C(=O)C=CC3=O)cc2)cc1)c1ccc(Oc2ccc(N3C(=O)C=CC3=O)cc2)cc1]

;

3,3'-dimethyl-5,5'-diethyl-4,4'-diphenylethane bismaleimide

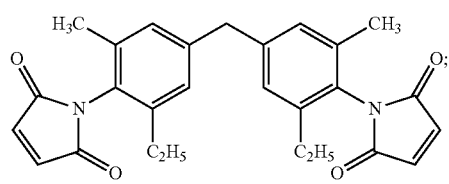 [SMILES: CCc1cc(Cc2cc(C)c(N3C(=O)C=CC3=O)c(CC)c2)cc(C)c1N1C(=O)C=CC1=O]

and 1,6-bismaleimide-(2,2,4-trimethyl)hexane

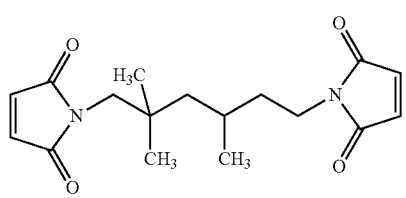

.

5. The low dielectric material of claim 3, wherein the polymer additives are selected from groups consisting of homopolymers of butadiene

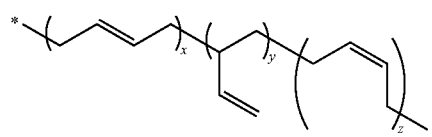

wherein y=70% and x+z=30%;

random copolymers of butadiene and styrene

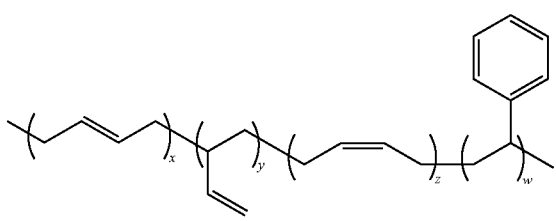

wherein y=30%, x+z=70% and w=≥1, and the amount of styrene=25 wt %;

maleinized polybutadiene

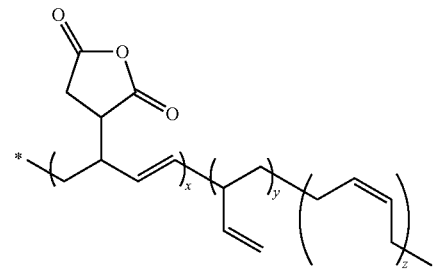

wherein y=28% and x+z=72%, the amount of maleic anhydride=8 wt %;

butadiene-styrene-divinylbenzene copolymer; and styrene maleic anhydride copolymer

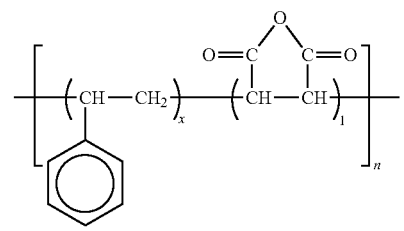

wherein X=1-8 and n≥1.

6. The low dielectric material of claim 1, further comprising at least one crosslinking agent with 40-80 parts by weight selected from the following groups consisting of

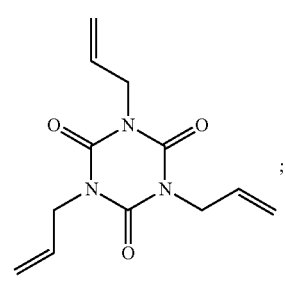

triallyl isocyanurate (TAIC)

-continued

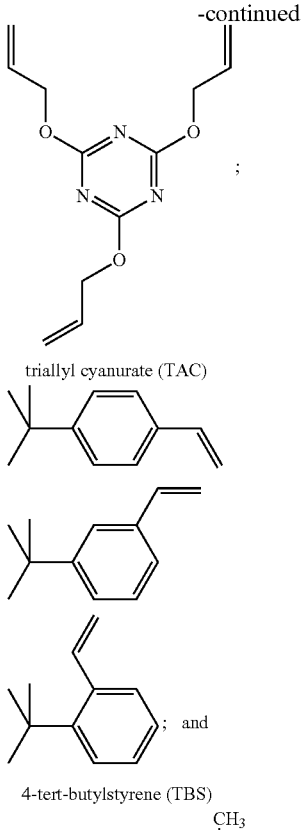

triallyl cyanurate (TAC)

4-tert-butylstyrene (TBS)

trimethallyl isocyanurate (TMAIC)

7. The low dielectric material of claim 1, further comprising catalysts including at least one peroxide having 116° C.-128° C. for a half life of 10 hours.

8. The low dielectric material of claim 7, wherein the catalysts including at least one peroxide selected from groups consisting of dicumyl peroxide, α,α'-bis(tert-butylperoxy) diisopropyl benzene and 2,5-di(tert-butylperoxy)-2,5-dimethyl-3-hexyne.

9. The low dielectric material of claim 1, further comprising fillers selected from groups consisting of fused silica, sphere-shaped silica, talc, aluminum silicate and soft silica.

10. The low dielectric material of claim 9, wherein the soft silica has a particle size in a range of 0.5 μm-10 μm.

11. The low dielectric material of claim 1, further comprising at least one flame retardant without halogen selected from the following groups consisting of phosphor-containing flame retardants and phosphates.

12. The low dielectric material of claim 11, wherein the phosphor-containing flame retardants are selected from groups consisting of HCA derivative (I), HCA derivative (II) and HCA derivative (III), HCA derivative (I) having the following paradiphenyl phosphoryl dibenzyl structure:

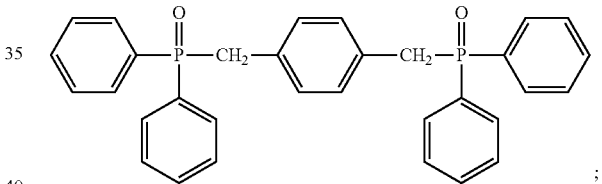

HCA derivative (II) having the following structure:

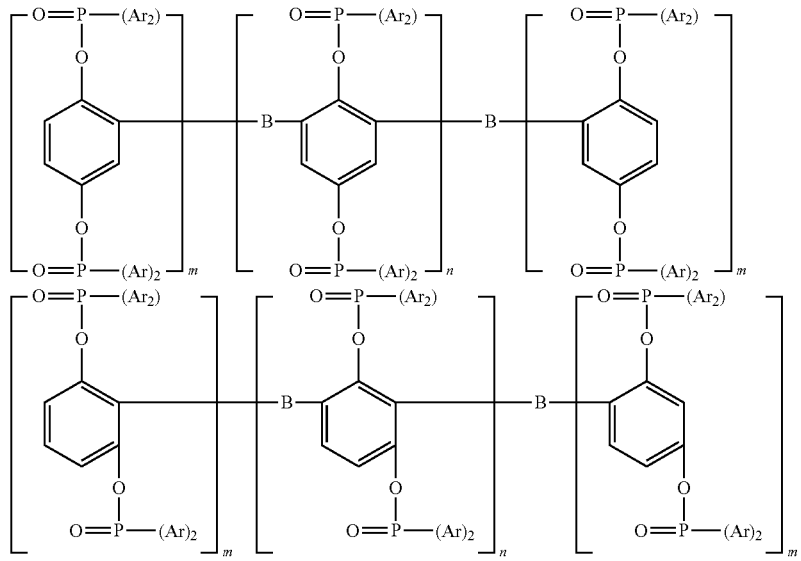

wherein with the proviso that when B is —CH$_2$—, —CH(CH$_3$)—, m is 1 and n is 1 to 3; with the proviso that when B is =CHCH=, m=2 and n=0; and HCA derivative (III) having the following structure:

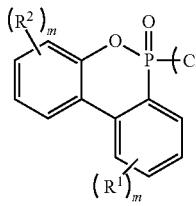 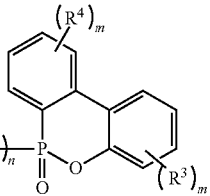

wherein A is a direct bond, C$_6$-C$_{12}$ aryl, C$_3$-C$_{12}$ cycloalkyl, or a C$_3$-C$_{12}$cycloalkenyl, wherein said cycloalkyl or cycloalkenyl may be optionally substituted by a C$_1$-C$_6$ alkyl;

each R$^1$, R$^2$, R$^3$ and R$^4$ are independently hydrogen, C$_1$-C$_{15}$ alkyl, C$_6$-C$_{12}$aryl, C$_7$-C$_{15}$ aralkyl or C$_7$-C$_{15}$ alkaryl; or R$^1$ and R$^2$ or R$^3$ and R$^4$ taken together can form a saturated or unsaturated cyclic ring, wherein said saturated or unsaturated cyclic ring may be optional substituted by a C$_1$-C$_6$ alkyl;

each m is independently 1, 2, 3 or 4 each R$^5$ and R$^6$ are independently hydrogen or a C$_1$-C$_6$ alkyl;

each n is independently 0, 1, 2, 3, 4 or 5;

with the proviso that when A is aryl or a direct bond, n cannot be 0.

* * * * *